US009749732B2

United States Patent
Liu et al.

(10) Patent No.: US 9,749,732 B2
(45) Date of Patent: Aug. 29, 2017

(54) METHOD AND APPARATUS FOR EARPHONE SOUND EFFECT COMPENSATION AND AN EARPHONE

(71) Applicant: Goertek Inc., Weifang (CN)

(72) Inventors: Song Liu, Weifang (CN); Linzhang Wang, Weifang (CN); Bo Li, Weifang (CN)

(73) Assignee: GOERTEK INC., Weifang (CN)

( * ) Notice: Subject to any disclaimer, the term of this patent is extended or adjusted under 35 U.S.C. 154(b) by 0 days.

(21) Appl. No.: 15/115,525

(22) PCT Filed: Sep. 9, 2015

(86) PCT No.: PCT/CN2015/089250
§ 371 (c)(1),
(2) Date: Jul. 29, 2016

(87) PCT Pub. No.: WO2016/107207
PCT Pub. Date: Jul. 7, 2016

(65) Prior Publication Data
US 2017/0171657 A1 Jun. 15, 2017

(30) Foreign Application Priority Data

Dec. 31, 2014 (CN) .......................... 2014 1 0854872

(51) Int. Cl.
*H04R 1/10* (2006.01)
*H04R 29/00* (2006.01)
*H03G 5/16* (2006.01)

(52) U.S. Cl.
CPC ........... *H04R 1/1041* (2013.01); *H03G 5/165* (2013.01); *H04R 29/001* (2013.01); *H04R 2460/15* (2013.01)

(58) Field of Classification Search
CPC H04R 1/1041; H04R 29/001; H04R 2460/15; H03G 5/165
See application file for complete search history.

(56) References Cited

U.S. PATENT DOCUMENTS

| 2014/0247952 | A1* | 9/2014 | Goldstein | ............ | H04R 1/1016 381/74 |
| 2014/0341388 | A1* | 11/2014 | Goldstein | ............ | H04R 1/1083 381/71.11 |
| 2015/0365776 | A1* | 12/2015 | Usher | .................... | H04R 25/70 381/59 |

FOREIGN PATENT DOCUMENTS

| CN | 102113346 | 6/2011 |
| CN | 102340717 | 2/2012 |

(Continued)

*Primary Examiner* — Andrew L Sniezek
(74) *Attorney, Agent, or Firm* — Harness, Dickey & Pierce, P.L.C.

(57) ABSTRACT

The present invention discloses a method and an apparatus for earphone sound effect compensation and an earphone. The method of the present invention comprises: obtaining monitored signal data in a current wearing state of an earphone user according to a signal collected by a monitoring microphone and an audio signal played by a loudspeaker of the earphone; computing error data of the monitored signal data in the current wearing state relative to standard signal data in a standard wearing state of the earphone; and performing sound effect compensation to the earphone according to the error data. The technical solution of the present invention adopts an adaptive digital signal processing manner, which can dynamically compensate for sound effects in different earphone wearing manners and enable an earphone user to appreciate an audible effect in a standard earphone wearing state.

10 Claims, 4 Drawing Sheets (56) References Cited

FOREIGN PATENT DOCUMENTS

| CN | 104661153 | 5/2015 |
|----|-----------|--------|
| EP | 2584558   | 4/2013 |

* cited by examiner

METHOD AND APPARATUS FOR EARPHONE SOUND EFFECT COMPENSATION AND AN EARPHONE

TECHNICAL FIELD

The present invention relates to the technical field of earphones, and more specifically to a method and an apparatus for earphone sound effect compensation and an earphone.

DESCRIPTION OF RELATED ART

Earphones have been widely applied in people's daily life and work. Compared with a traditional audible manner using a high-fidelity sound system, earphones do not need a fixed place due to its small size and portability; moreover, with the advance of micro loudspeaker technologies, many excellent earphones can also achieve a very wide and flat frequency-response curve, thereby guaranteeing high-fidelity music enjoyment. Therefore, earphones have been favored by more and more consumers. However, many manufacturers only focus much attention on the quality of earphones per se, while neglect that a user's earphone wearing condition will also affect an audible effect that should be brought by the earphones.

Due to factors such as different ear shapes, different tightness of earphone wearing, and different wearing manners, earphone users always cannot get a nominal audible effect of the earphones. Experiments prove that incorrect wearing manners will have an adverse impact on such as low frequency, medium-high frequency and reverberation when listening. At present, few earphone products compensate for sound effect with respect to earphone wearing and coupling conditions; besides, sound effect detection mostly adopts the method of acoustic detection. This acoustic detection method is relatively complex to compute and susceptible to external interference, such that misjudgment easily occurs.

BRIEF SUMMARY OF THE INVENTION

In view of the above, a main objective of the present invention is to provide a method and an apparatus for earphone sound effect compensation and an earphone, which can eliminate interference from an external environment and dynamically compensate for sound effect with respect to different earphone wearing manners, such that an earphone user obtains an audible effect in a standard earphone wearing condition.

In order to achieve the above objective, the technical solution of the present invention is implemented as such:

On one hand, an embodiment of the present invention provides a method for earphone sound effect compensation, a monitoring microphone being provided within a coupled cavity for coupling an earphone to a human ear; the method comprising:

obtaining monitored signal data in a current wearing state of an earphone user according to a signal collected by the monitoring microphone and an audio signal played by a loudspeaker of the earphone;

computing error data of the monitored signal data in the current wearing state relative to standard signal data in a standard wearing state of the earphone; and performing sound effect compensation to the earphone according to the error data.

On the other hand, the embodiments of the present invention further provide an apparatus for earphone sound effect compensation, the apparatus comprising:

a monitored data obtaining unit configured to obtain monitored signal data in a current wearing state of an earphone user according to a signal collected by a monitoring microphone within a coupled cavity for coupling the earphone to a human ear and an audio signal played by a loudspeaker of the earphone;

an error data computing unit configured to compute error data of the monitored signal data in the current wearing state relative to standard signal data in a standard wearing state of the earphone;

a sound effect compensating unit configured to perform sound effect compensation to the earphone based on the error data.

In a further aspect, embodiments of the present invention provide an earphone, comprising an apparatus for earphone sound effect compensation provided by the abovementioned embodiments, a monitoring microphone being provided within a coupled cavity for coupling the earphone to a human ear.

Compared with the prior art, the present invention provides the following advantageous effects:

According to the technical solutions of the embodiments of the present invention, by monitoring signals from the microphone within the coupled cavity and the earphone loudspeaker, a current earphone wearing state of a user can be obtained in real-time; and dynamic sound effect compensation for different earphone wearing states can be performed based on error data between the wearing states, thereby implementing a novel-model earphone sound effect compensation solution, such that the earphone user can appreciate an optimal audible effect. Moreover, because the embodiments of the present invention employ an adaptive digital signal processing method, the implementation manner is simple, and the anti-interference capability is strong.

BRIEF DESCRIPTION OF THE SEVERAL VIEWS OF THE DRAWINGS

The accompanying drawings provide further understanding of the present invention and constitute a part of the specification, which, together with the embodiments of the present invention, are used for explaining the present invention, without constituting a limitation to the present invention. In the accompanying drawings.

DETAILED DESCRIPTION OF THE INVENTION

A main technical idea of the present invention is to combine an earphone coupled intelligent detection with sound effect compensation, and for a user's different earphone wearing states, to intelligently eliminate interferences from external environments, to real-time detect and track coupled conditions of earphone wearing, and to employ a dynamic sound effect compensation method dependent on different coupled conditions, such that the earphone user appreciates an optimum audible effect.

In order to make the objective, technical solutions and advantages of the present invention much clearer, the embodiments of the present invention will be described in further detail with reference to the accompanying drawings.

The present invention adopts an adaptive digital signal processing method, which is easily implemented while insusceptible to external interference. A monitoring microphone is disposed within a coupled cavity coupling the earphone to a human ear. When the coupled cavity changes, the signal collected by the monitoring microphone will also change. By real-time monitoring the signal collected by the microphone, the earphone wearing and coupling conditions can be known.

When the earphone plays a signal, the signal is played from a loudspeaker of the earphone, which, after being acoustically propagated within the coupled cavity, is finally collected by the in-built monitoring microphone. The inventors derive, from the perspective of digital signal processing, that the collected signal may be obtained by convoluting a filter to the played signal. Further, when the coupled cavity changes, i.e., when the earphone wearing and coupling manner changes, the filter will also change correspondingly. Therefore, a wearing state of the earphone can be derived reversely after evaluating a function of the filter. Further, the to-be-played signal is strongly correlated with a signal collected from within the coupled cavity, such that the filter may be evaluated by adopting the digital signal.

Figure 1:
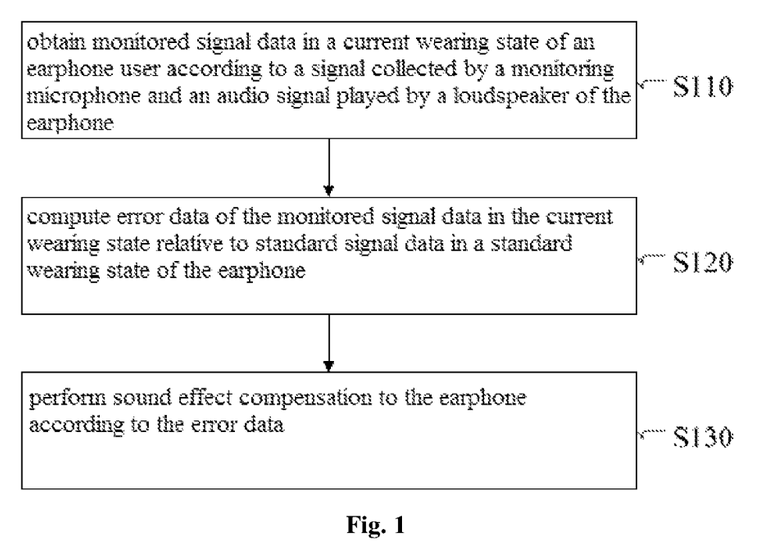
FIG. 1 is a flow diagram of a method for earphone sound effect compensation provided by an embodiment of the present invention.

On one hand, the embodiments of the present invention provide a method for earphone sound effect compensation. FIG. 1 illustrates a flow diagram of the method for earphone sound effect compensation according to an embodiment of the present invention. As shown in FIG. 1, the method comprises:

Step S110, obtain monitored signal data in a current wearing state of an earphone user according to a signal collected by a monitoring microphone and an audio signal played by a loudspeaker of the earphone.

Specifically, in the current wearing state, a current filter function corresponding to an acoustic path of a coupled cavity is computed according to a cross-correlation function between the signal collected by the monitoring microphone and an audio signal played by the loudspeaker of the earphone, so as to obtain the monitored signal data in the current wearing state of the earphone user based on the current filter function.

More specifically, in the current wearing state, current filter functions of respective time points are computed by adoptive filtering within a predetermined time; a data window is set, and current filter functions of respective time points based on the data window are sampled; when a mean variance of a predetermined number of continuously sampled current filter functions does not exceed a steady-state threshold, it is determined that the computed current filter functions of respective time points reach a steady state; afterwards, any one of the current filter functions that reach a steady state or a mean value of the current filter functions of respective time points is used as the monitored signal data.

Step S120, compute error data of the monitored signal data in the current wearing state relative to standard signal data in a standard wearing state of the earphone.

In order to obtain the wearing state error data, it is needed to obtain in advance the standard signal data in the earphone's standard wearing state, wherein obtaining the standard signal data in the earphone's standard wearing state comprises:

In the standard wearing state, computing a standard filter function corresponding to an acoustic path of the coupled cavity according to a cross-correlation function between the signal collected by the monitoring microphone and an M-sequence signal played by the loudspeaker of the earphone, thereby obtaining the standard signal data according to the standard filter function.

The step S120 specifically comprises: computing a current filter frequency-domain function of the current filter function, and computing a standard filter frequency-domain function of the standard filter function; dividing the frequency into a predetermined number of frequency bands according to the sound effect; on each of the frequency bands, computing a mean value of amplitude differences of the current filter frequency-domain function and the standard filter frequency-domain function, or computing an area value enclosed by the frequency-response curves of the current filter frequency-domain function and the standard filter frequency-domain function; using the mean value of the amplitude differences or the area value enclosed by the frequency-response curves as the error data for the earphone sound effect compensation.

Step S130, perform sound effect compensation to the earphone according to the error data.

The step S130 specifically comprises: presetting a first threshold and a second threshold that is less than the first threshold; for each of the frequency bands divided according to the sound effect, the following processing is performed, respectively:

When confirming, based on the error data, that an amplitude value of the current filter frequency-domain function is in an attenuated state relative to that of the standard filter frequency-domain function, and that an attenuated value exceeds a first threshold, performing EQ (Equalizer) sound effect compensation and DRC (Dynamic Range Control) sound effect compensation concurrently to the audio signal played by the loudspeaker;

When confirming, based on the error data, that the amplitude value of the current filter frequency-domain function relative to that of the standard filter frequency-domain function is in an attenuated state, and that an attenuated value is less than the first threshold but larger than a second threshold, only performing the EQ sound effect compensation to the audio signal played by the loudspeaker;

When confirming, based on the error data, that the amplitude value of the current filter frequency-domain function is in an enhanced state relative to that of the standard filter frequency domain function, and that an enhanced value is larger than the second threshold, only performing EQ sound effect compensation to the audio signal played by the loudspeaker;

When confirming, based on the error data, that an amplitude value change of the current filter frequency-domain function relative to the standard filter frequency-domain function is less than the second threshold, not performing sound effect compensation to the audio signal played by the loudspeaker.

The method for earphone sound effect compensation according to the embodiments of the present invention adopts an adaptive digital signal processing method. The monitored signal data in the current wearing state of the earphone user is obtained by the monitoring microphone; error data of the monitored signal data relative to the standard signal data in the earphone's standard wearing state is computed; and sound effect compensation is made to the earphone based on the error data. This can eliminate interference from external environment and enables real-time monitoring and dynamic compensating to the current wearing state of the earphone user, such that the earphone user appreciates an optimum audible effect.

Figure 2:
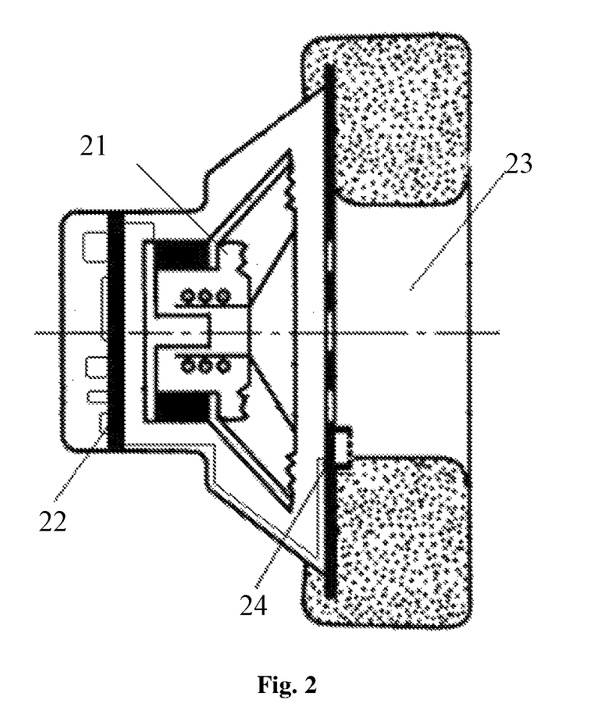
FIG. 2 is a schematic diagram of an earphone having a sound effect compensation performance provided by an embodiment of the present invention.

FIG. 2 illustrates a schematic diagram of an earphone having a sound effect compensation performance provided according to the embodiments of the present invention. The sound emitted from the loudspeaker 21 is controlled by a signal processing circuit board 22; meanwhile, the data collected by the monitoring microphone 24 within a coupled cavity 23 will also be fed back to the signal processing circuit board 22 for operation, and the signal processing circuit board 22 will perform adaptive filtering processing to the signal. Because the adaptive filtering is sensitive to the external noise, a convergence stability of the adaptive filter is used to determine whether the external interference exists, as well as how a credibility level of the filtering result is. An equivalent filter function from the loudspeaker to the monitoring microphone is computed; the filter function is transformed to the frequency domain; a frequency-response of the filtering is evaluated; then, the error data is derived by comparing the frequency-response with the filter function frequency-response in the standard wearing; further, sound effect compensation is performed based on the frequency domain where the error is located; finally, the signal collected by the monitoring microphone is made to approach the signal collected upon standard wearing, thereby causing the earphone user to reach or approach to an audible effect of standard wearing.

Figure 3:
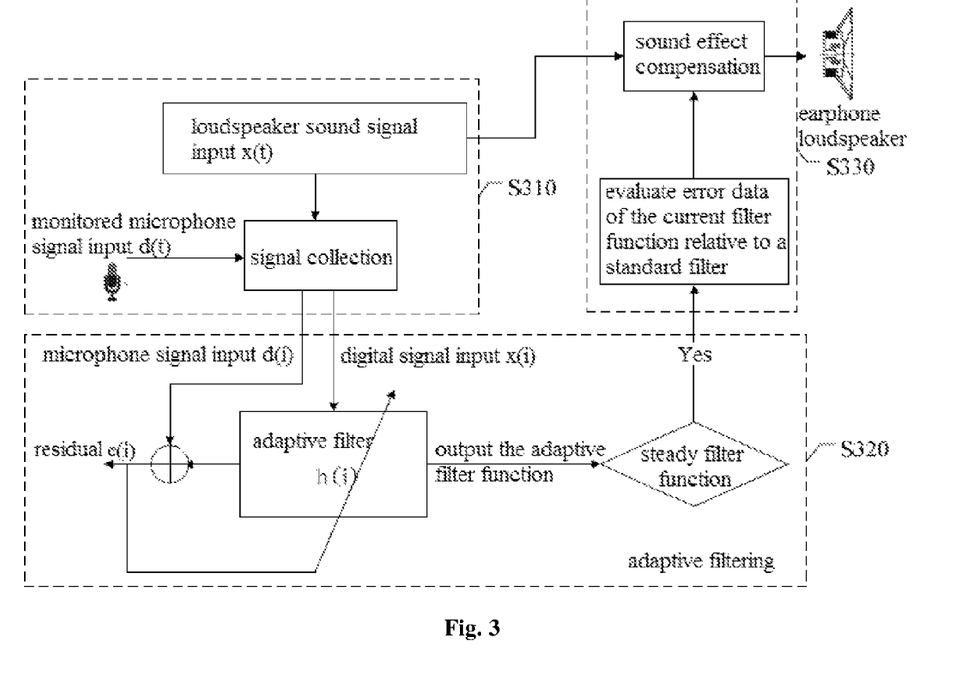
FIG. 3 is a working principle diagram of a method for earphone sound effect compensation according to an embodiment of the present invention.

FIG. 3 illustrates a working principle diagram of a method for earphone sound effect compensation according to the embodiments of the present invention. As illustrated in FIG. 3, a procedure for earphone sound effect compensation comprises the following three stages:

S310, signal collecting stage, comprising collecting a loudspeaker sound signal x(t), collecting a signal d(t) of the monitoring microphone, where t denotes a sampling time, and sampling analog signals to obtain digital signals x(i) and d(i), respectively, so as to be inputted to an adaptive filter.

S320, adaptive filtering stage, comprising performing adaptive filtering to the input digital signals x(i) and d(i), outputting an adaptive filter function, and when the adaptive filter function reaches a steady state, evaluating monitored signal data in a current wearing state of the earphone user, the monitored signal data being just the current filter function. When the filter function is in a changing period and has not reached a steady state, updating the earphone sound effect compensation is suspended to maintain a previous sound effect compensation.

S330, sound effect compensation stage, i.e., performing sound effect compensation to the output signal of the loudspeaker based on error data between the current filter function (the monitored signal data in the current wearing state when the adaptive filter function reaches a steady state) and a standard filter function (standard signal data in the standard wearing state of the earphone), such that the earphone user reaches or approaches to the audible effect of standard wearing.

Hereinafter, the working principle of the earphone sound effect compensating method of FIG. 3 will be described in detail.

The sound signal played within the earphone loudspeaker is x(t), the external noise is n(t), the signal collected by the monitoring microphone within the coupled cavity is d(t), while a propagation path from the loudspeaker to the monitoring microphone is denoted by the filter h(t); accordingly, the following expression is derived:

$$d(t)=x(t)*h(t)+n(t)$$

h(t) is a parameter that can reflect coupling between an earphone and a human ear. According to the adaptive filter theory, $\hat{h}(t)$ is used to approximate a true h(t), and an approximation principle is set to minimizing the signal mean square value statistics of the error. Analog signals are sampled to derive a digital signal denoted by $\xi(i)$, where i is used to express sampling to t, namely:

$$\xi(t)=E[(d(i)-x(i)*\hat{h}(t))^2]=\min$$

In this way, the adaptive filter function may be evaluated. The above equation shows that in the case of external noise n(i)≡0, $\hat{h}(t)$ will approximate h(i) infinitely; when the external noise changes, n(i)≠0, $\hat{h}(t)$ will change; the external noise interference is identified based on the change of $\hat{h}(t)$. In this way, the impact from the external noise on the judgment may be avoided.

After $\hat{h}(i)$ is evaluated, it is compared with the filter function $\hat{h}_{std}$ (i) in the standard earphone wearing, thereby obtaining the desired error data.

It should be noted that because each product is different, so is the position of mounting the microphone of the coupled cavity, the filter function in the standard wearing will be different. For a new product, the filter function of its standard wearing needs to be evaluated without exception. In order to ensure the evaluating precision, it may be required to wear the earphone in a standard method in an audition lab to detect a normalized filter function corresponding to the acoustic path of the coupled cavity. The specific detection method is provided as follows:

Suppose the loudspeaker is inputted with a white-noise series u(i) with a power of 1; the monitoring microphone performs collection; the collected output signal is y(i); the cross-correlation between the input and the output is computed as:

$$r_{uy}(m)=E\{u(i)y(i+m)\}=r_u(m)*h(m)$$

wherein, $r_u(m)$ is an auto-correlation function of the input; because the input is a white noise with a power of 1, $r_u(m)=\delta(m)$ is derived as an impulse function, namely:

$$r_{uy}(m)=h(m)$$

The above expression indicates that by evaluating the cross-correlation function $r_{uy}(m)$ between the input and the output, the system's filter function is evaluated. In order to further ensure the effectiveness and precision of the computation, M-sequence may be used instead of the white noise, such that the filter function in standard wearing may be evaluated, denoted as $\hat{h}_{std}$ (m). Of course, with this method, filter functions in various kinds of different wearing states may also be evaluated.

After $\hat{h}_{std}$ (m), according to a mean square error statistics minimizing principle, a derivative of $\hat{h}(i)$ is found, such that a gradient function may be derived as:

$$\nabla = 2R\hat{h} - 2p$$

wherein $\nabla$ denotes the gradient, R denotes an auto-correlation matrix of the loudspeaker signal x(i), P denotes a cross-correlation matrix between the microphone input d(i) and the loudspeaker input x(i). Then, based on the statistical mean value of the gradient, a recurrence relation of the filter function is derived as follows:

$$\hat{h}(m+1) = \hat{h}(m) + 2\mu e(m) \times (m)$$

After an error range is set, the filter function $\hat{h}(m)$ in the current wearing state will finally reach a steady value; however, when noise occurs in the external or the earphone is artificially moved, $\hat{h}(m)$ will change; during change of $\hat{h}(m)$, it is needed to stop compensation for the earphone sound effect. In other words, at this time, a previous sound effect compensation needs to be held, till reaching the steady state again when an error between the current filter and the standard filter is only re-computed, so as to re-do the sound effect compensation. This processing manner avoids excessively heavy data processing burden caused by too frequent sound effect regulation; besides, too frequent regulations cannot bring a better auditory perception, thereby guaranteeing reasonable adjustment of the sound effect within a human ear-sensible range so as to conform to the human ear's auditory features.

Because it is a temporal-domain adaptive filter that is adopted, the filter function will be updated at one sampling point after another. Considering that the output update of the filter function is not required to be so fast, an embodiment of the present invention sets a data window. Generally, the window N has 128 or 256 points, i.e., the data update is performed once each time of sampling N points. In other words, a $\hat{h}(m)$ vector can be obtained every N points.

Suppose the $\hat{h}(m)$ vector is L-order (which is decided by the computation decision, generally taking L=64 or 128). Here, the criterion for judging stability is an average variance of $\hat{h}(m)$ values of M (M generally takes 10~100) sampling points closest to the current processing time point; when the average variance of the closest M $\hat{h}(m)$ does not exceed a certain steady-state threshold, it may be determined that the current $\hat{h}(m)$ is a steady value; otherwise, it is deemed that $\hat{h}(m)$ is not steady. Finally, the steady-state $\hat{h}(m)$ is subjected to a normalized processing.

In this way, based on the signal collected by the monitoring microphone and the audio signal played by the loudspeaker of the earphone, adaptive filtering is performed to obtain a steady-state normalized filter function $\hat{h}(m)$. Because the difference between currently processed filters at different time points when reaching the steady state, any of the current filter functions that reach the steady state may be used as the monitored signal data in the current wearing state of the earphone user; or, in order to further reduce error and guarantee precision, an average value of the current filter functions of respective time points that are currently processed is evaluated; the evaluated average value is used as the monitored signal data in the current wearing state of the earphone user.

After the filter function $\hat{h}_{std}$ (m) of the standard wearing state and the filter function $\hat{h}(m)$ in the current wearing state are evaluated, the next step is to determine how large the difference between $\hat{h}(m)$ and $\hat{h}_{std}(m)$ is, and where the difference is; in order to accurately correspond this difference to an audible effect of the human ear, $\hat{h}(m)$ and $\hat{h}_{std}(m)$ are transformed to the frequency domain for comparison. The specific manner is provided below:

$\hat{h}(m)$ and $\hat{h}_{std}(m)$ are transformed into the frequency domain through an FFT (Fast Fourier Transformation) to the frequency domain, deriving the current filter frequency-domain function $\hat{H}(jw)$ and the standard filter frequency-domain function $\hat{H}_{std}(jw)$, respectively; based on the sound effect of the system, the frequency-response curves of the $\hat{H}(jw)$ and $\hat{H}_{std}(jw)$ are partitioned into corresponding frequency bands (e.g., partitioned into 10 frequency bands); a difference between frequency-response curves of $\hat{H}(jw)$ and $\hat{H}_{std}(jw)$ on each of the frequency bands is computed, thereby evaluating each frequency point of the error data and error sizes between the amplitudes.

Figure 4:
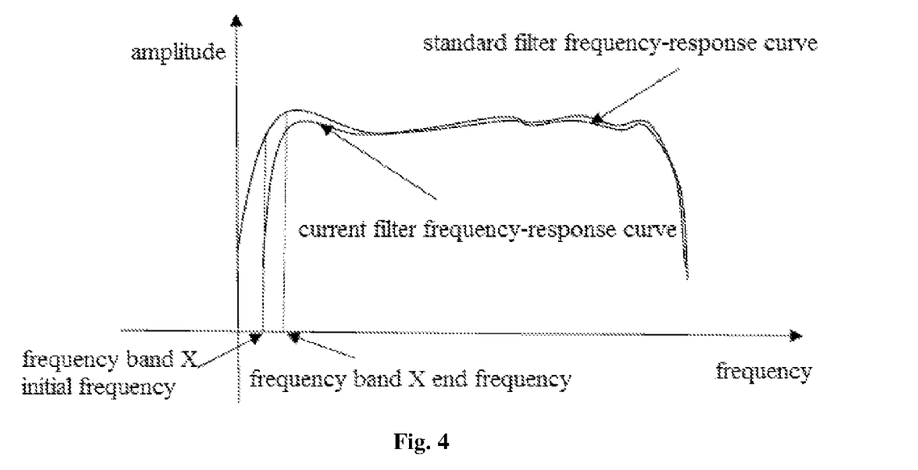
FIG. 4 is a schematic diagram of frequency-response curve matching according to an embodiment of the present invention.

FIG. 4 illustrates a schematic diagram of frequency-response curve matching according to an embodiment of the present invention. The frequency-response curve is a curve denoting frequency-amplitude of a signal. FIG. 4 includes a standard filter frequency-response curve and a current filter frequency-response curve; the entire frequency-response curve is divided into a plurality of frequency bands according to a system sound effect; on each of the frequency bands (e.g., frequency band X), a mean value of the amplitude differences between the current filter $\hat{H}(jw)$ and the standard filter $\hat{H}_{std}(jw)$ is computed. The specific computation manner may be computing a difference between the amplitudes of the two frequency-response curves within the frequency band at one frequency point after another (the amplitude values of two frequency-response curves are subtracted; the difference value may be positive, negative, or 0); the differences between the amplitudes of all frequency points of the frequency band are averaged to derive a mean value of amplitude differences. Or, an area value (vector) enclosed by two frequency-response curves of the $\hat{H}(jw)$ and $\hat{H}_{std}(jw)$. The specific computation manner may be computing an area enclosed by the current filter frequency-response curve in the frequency band and an area enclosed by the standard filter frequency-response curve in the frequency band. The area value enclosed by two frequency-response curves is derived by subtracting two areas (the area value may be positive, negative, or 0). The computed mean value of the amplitude differences or the area value enclosed by the frequency-response curves is used as the error data for the earphone sound effect compensation.

After the error data of each of the frequency bands is obtained, an EQ compensation and dynamic range control compensation may be designed so as to perform sound effect compensation to the earphone based on the error data. Specifically, the error data are compensated using the sound effect algorithm. The embodiments of the present invention perform sound effect compensation in the following two manners: one is EQ compensation, and the other is dynamic range control (DRC) compensation. The two manners are performed per frequency.

For example, the sound effect compensation capability has 10 frequency bands; a threshold A and a threshold B are preset; moreover, the threshold B is less than the threshold A; then for each of the frequency bands, the following processing is performed, respectively:

1. When a value of the current filter of the present frequency band is in an attenuated state compared with a value of the standard filter, i.e., a mean value of the amplitude differences between the frequency-response curve of the current filter frequency-domain function and that of the standard filter frequency-domain function is in a decreased state or the area value enclosed by two frequency-response curves is in a decreased state, and the decreased value of the mean value of the amplitude differences of the two frequency-response curves or the decreased value of the area value enclosed by two frequency-response curves exceeds the threshold A, the audio signal played by the loudspeaker is compensated simultaneously by EQ and DRC.

2. When the value of the current filter of the present frequency band is in an attenuated state compared with the value of the standard filter, i.e., when the mean value of the amplitude differences between the frequency-response curve of the current filter frequency-domain function and that of the standard filter frequency-domain function is in a decreased state or the area value enclosed by the two frequency-response curves is in a decreased state, and when the decreased value of the mean value of the amplitude differences of the two frequency-response curves or the decreased value of the area value enclosed by the two frequency-response curves is less than the threshold A but larger than the threshold B, the audio signal played by the loudspeaker is only compensated using EQ.

3. When the value of the current filter of the present frequency band is in an enhanced state compared with the value of the standard filter, i.e., when the mean value of the amplitude differences between the frequency-response curve of the current filter frequency-domain function and that of the standard filter frequency-domain function is in an incremental state or the area value enclosed by the two frequency-response curves is in an incremental state, and when the incremental value of the mean value of the amplitude differences of the two frequency-response curves or the incremental value of the area value enclosed by the two frequency-response curves is greater than the threshold B, the audio signal played by the loudspeaker is only compensated using EQ. It should be noted that in the actual wearing use of the earphone, an incremental state rarely occurs, i.e., even it occurs, its enhanced value would not be very large.

4. When a change of the value of the current filter of the frequency band compared with the value of the standard filter is less than the threshold B, i.e., a changed value of a mean value of the amplitude differences between the frequency-response curve of the current filter frequency-domain function and that of the standard filter frequency-domain function or a changed value of the area value enclosed by two frequency-response curves is less than the threshold B, no processing is performed, i.e., no sound effect compensation is made to the audio signal played by the loudspeaker.

In view of the above, the embodiments of the present invention provide a novel method for adaptive sound effect compensation, which can eliminate interference from the external, perform real-time detection to the earphone wearing situation, and design different sound effects according to wearing to perform dynamic compensation, such that the earphone user reaches an optimal audible effect.

Figure 5:
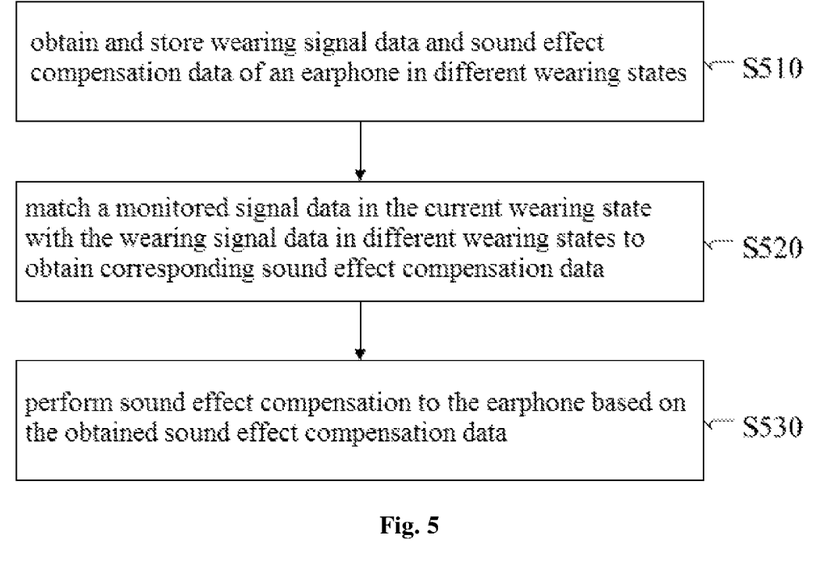
FIG. 5 is a flow diagram of another method for earphone sound effect compensation according to an embodiment of the present invention.

FIG. 5 illustrates a flow diagram of another method for earphone sound effect compensation according to an embodiment of the present invention. FIG. 5 is an alternative solution of the method for earphone sound effect compensation of FIG. 2. As shown in FIG. 5, the method comprises:

Step S510, obtaining and storing wearing signal data and sound effect compensation data of an earphone in different wearing states.

Specifically, a same manner as evaluating the filter function $\hat{H}_{std}(m)$ in standard wearing may be employed to input M sequences to a loudspeaker in an auditory lab, so as to evaluate filter functions $\hat{h}_1(m), \hat{h}_2(m), \hat{h}_3(m), \ldots, \hat{h}_7(m)$ under various kinds of different wearing states.

Corresponding to the filter functions under different wearing states, corresponding sound effect compensation data may be obtained based on an audio engineer's preliminary audible effect feedback information; and a correspondence relationship between the filter function and the sound effect compensation data is pre-stored.

Step S520, matching monitored signal data in the current wearing state with the wearing signal data in different wearing states to obtain corresponding sound effect compensation data.

The specific matching manner may be comparing the current filter function with pre-obtained filter functions $\hat{h}_1(m), \hat{h}_2(m), \hat{h}_3(m), \ldots, \hat{h}_7(m)$ in various kinds of different wearing states, and taking the sound effect compensation data corresponding to the closest filter function.

Step S530, performing sound effect compensation to the earphone based on the obtained sound effect compensation data.

The method for earphone sound effect compensation method of FIG. 5 may quickly reach the sound effect compensation result or approximate the audible effect of standard earphone wearing.

Figure 6:
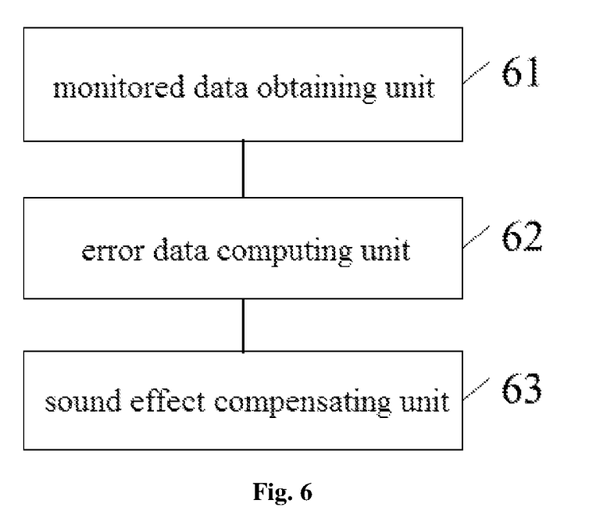
FIG. 6 is a structural diagram of an apparatus for earphone sound effect compensation according to an embodiment of the present invention.

In another aspect, embodiments of the present invention further provide an apparatus for earphone sound effect compensation. FIG. 6 illustrates a structural diagram of an apparatus for earphone sound effect compensation according to the embodiments of the present invention. As illustrated in FIG. 6, the apparatus comprises: a monitored data obtaining unit 61, an error data computing unit 62, and a sound effect compensating unit 63.

the monitored data obtaining unit 61 is configured to obtain monitored signal data in a current wearing state of an earphone user according to a signal collected by a monitoring microphone within a coupled cavity for coupling the earphone to a human ear and an audio signal played by a loudspeaker of the earphone;

the error data computing unit 62 is configured to compute error data of the monitored signal data in the current wearing state relative to standard signal data in a standard wearing state of the earphone;

the sound effect compensating unit 63 is configured to perform sound effect compensation to the earphone based on the error data.

Based on the embodiments of FIG. 6, the monitored data obtaining unit 61 further comprises: a filter function computing unit 611, an adaptive filtering module 612, a sampling module 613, a steady-state determining module 614, and a monitored data determining module 615; the error data computing unit 62 further comprises: a frequency-domain function computing module 621, a frequency-band dividing module 622, and an error data computing module 623; and the sound effect compensating unit 63 further comprises: a threshold and frequency band setting module 631, a first compensating module 632, a second compensating module 633, a third compensating module 634, and a sound effect holding module 635.

Figure 7:
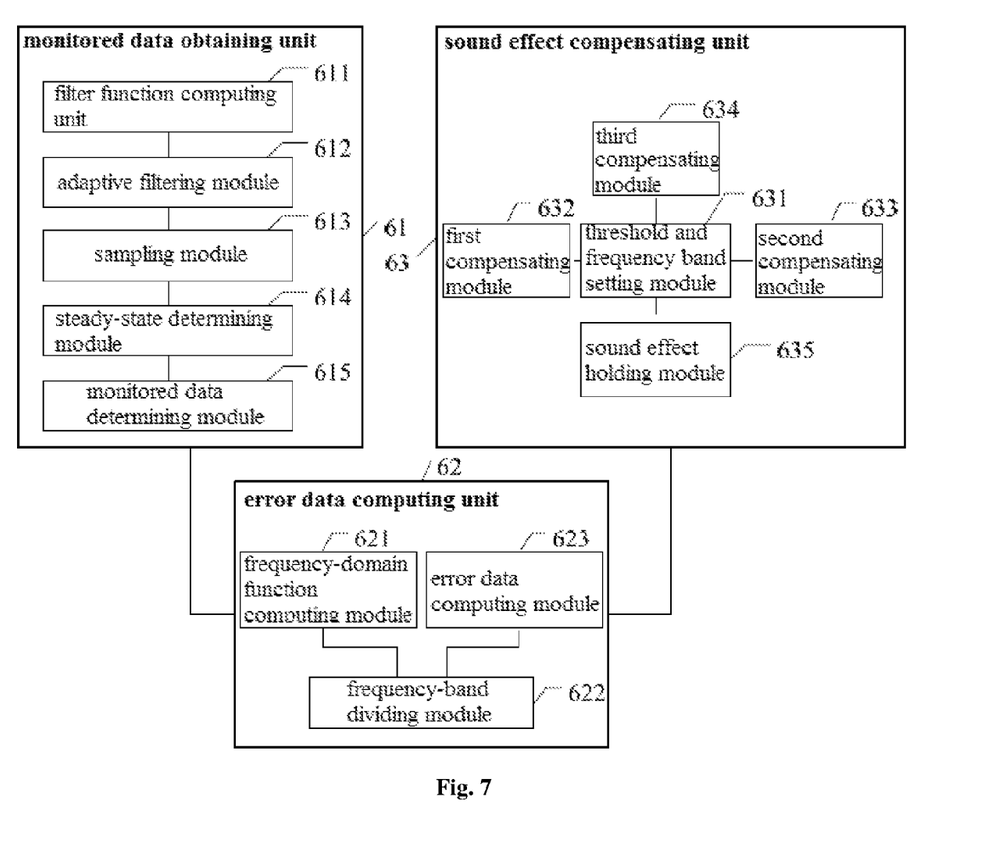
FIG. 7 is a structural diagram of another apparatus for earphone sound effect compensation provided by an embodiment of the present invention.

Specifically, FIG. 7 illustrates a structural diagram of another apparatus for earphone sound effect compensation provided by the embodiments of the present invention.

In the monitored data obtaining unit 61,

The filter function computing module 611 is configured to compute a current filter function corresponding to an acoustic path of a coupled cavity according to a cross-correlation function between the signal collected by the monitoring microphone and the audio signal played by the loudspeaker of the earphone;

The adaptive filtering module 612 is configured to, in the current wearing state, compute current filter functions of respective time points by adaptive filtering within a predetermined time;

The sampling module 613 is configured to set a data window, and sample current filter functions of respective time points based on the data window;

The steady-state determining module 614 is configured to, when a mean variance of a predetermined number of continuously sampled current filter functions does not exceed a steady-state threshold, determine that the computed current filter functions of respective time points reach a steady state;

The monitored data determining module 615 is configured to use any one of the current filter functions that reach a steady state or a mean value of the current filter functions of respective time points is as the monitored signal data.

In the error data computing unit 62,

The frequency-domain function computing module 621 is configured to compute a current filter frequency-domain function of the current filter function, and compute a standard filter frequency-domain function of the standard filter function;

The frequency band dividing module 622 is configured to divide the frequency into a predetermined number of frequency bands according to the sound effect;

The error data computing module 623 is configured to, on each of the frequency bands, compute a mean value of amplitude differences of the frequency-response curves of the current filter frequency-domain function and the standard filter frequency-domain function, or compute an area value enclosed by the frequency-response curves of the current filter frequency-domain function and the standard filter frequency-domain function; and use the mean value of the amplitude differences or the area value enclosed by the frequency-response curves as the error data for the earphone sound effect compensation.

In the sound effect compensating unit 63,

The threshold value and frequency-band setting module 631 is configured to preset a first threshold and a second threshold, the second threshold being less than the first threshold; and perform sound effect compensation to each of the frequency bands divided according to the sound effect, respectively;

The first compensation module 632 is configured to when confirming, based on the error data, that an amplitude value of the current filter frequency-domain function is in an attenuated state relative to that of the standard filter frequency-domain function, and that an attenuated value exceeds a first threshold, perform EQ (Equalizer) sound effect compensation and DRC (Dynamic Range Control) sound effect compensation concurrently to the audio signal played by the loudspeaker;

The second compensating module 633 is configured to when confirming, based on the error data, that the amplitude value of the current filter frequency-domain function relative to that of the standard filter frequency-domain function is in an attenuated state, and that an attenuated value is less than the first threshold but larger than a second threshold, only perform the EQ sound effect compensation to the audio signal played by the loudspeaker;

The third compensating module 634 is configured to when confirming, based on the error data, that the amplitude value of the current filter frequency-domain function is in an enhanced state relative to that of the standard filter frequency domain function, and that an enhanced value is larger than the second threshold, only perform EQ sound effect compensation to the audio signal played by the loudspeaker;

The sound effect holding module 635 is configured to when confirming, based on the error data, that an amplitude value change of the current filter frequency-domain function relative to the standard filter frequency-domain function is less than the second threshold, not perform sound effect compensation to the audio signal played by the loudspeaker.

The apparatus for earphone sound effect compensation according to the embodiments of the present invention adopts an adaptive digital signal processing manner, where the monitored signal data in the current wearing state of the earphone user is obtained by the monitored data obtaining unit through monitoring the microphone; the error data computing unit computes the error data of the monitored signal data relative to the standard signal data in the earphone's standard wearing state; and the sound effect compensating unit performs sound effect compensation to the earphone based on the error data. This can eliminate interference from external environment and enables real-time monitoring and dynamic compensating to the current wearing state of the earphone user, such that the earphone user reaches an optimum audible effect.

In one preferred embodiment, the apparatus for earphone sound effect compensation according to the present invention further comprises: a wearing data obtaining unit is configured to obtain and store wearing signal data and sound effect compensation data of an earphone in different wearing states.

In this case, the error data computing unit 62 is further configured to match monitored signal data in the current wearing state with the wearing signal data in different wearing states to obtain corresponding sound effect compensation data; correspondingly, the sound effect compensating unit 63 is further configured to perform sound effect compensation to the earphone based on the obtained sound effect compensation data.

The technical solution of the preferred embodiment may enable fast reaching a desired sound effect compensation or approximating the audible effect of standard earphone wearing. The specific working manners of respective units in the apparatus embodiment of the present invention may refer to the method embodiments of the present invention, which will not be detailed here.

In another aspect, the embodiments of the present invention further provide an earphone that comprises an apparatus for earphone sound effect compensation provided by the technical solution above, with a monitoring microphone being disposed within a coupled cavity that couples the earphone to a human ear. This will not be detailed here.

In view of the above, a method and an apparatus for earphone sound effect compensation and an earphone as disclosed in the embodiments of the present disclosure adopt an adaptive digital signal processing manner, with a monitoring microphone being disposed in a coupled cavity for coupling the earphone and the human ear, wherein the monitored signal data in the current wearing state of the earphone user is obtained by the monitoring microphone; error data of the monitored signal data relative to the standard signal data in the earphone's standard wearing state is computed; and sound effect compensation is made to the earphone based on the error data. This can eliminate interference from external environment and enables real-time monitoring and dynamic compensating to the current wearing state of the earphone user, such that the earphone user reaches an optimum audible effect.

What have been described above are only preferred embodiments of the present invention, not intended to limit the protection scope of the present invention. Any modifications, equivalent substitutions, and improvements made within the spirit and principle of the present invention are included within the protection scope of the present invention.

The invention claimed is:

1. A method for earphone sound effect compensation, wherein a monitoring microphone is provided within a coupled cavity for coupling an earphone to a human ear; the method comprising:
obtaining monitored signal data in a current wearing state of an earphone user according to a signal collected by the monitoring microphone and an audio signal played by a loudspeaker of the earphone;
computing error data of the monitored signal data in the current wearing state relative to standard signal data in a standard wearing state of the earphone; and
performing sound effect compensation to the earphone according to the error data;
wherein the computing error data of the monitored signal data in the current wearing state relative to standard signal data in a standard wearing state of the earphone comprises:
computing a current filter frequency-domain function of a current filter function, and computing a standard filter frequency-domain function of a standard filter function;
dividing a frequency into a predetermined number of frequency bands according to the sound effect;
on each of the frequency bands, computing a mean value of amplitude differences of the frequency-response curves of the current filter frequency-domain function and the standard filter frequency-domain function, or computing an area value enclosed by the frequency-response curves of the current filter frequency-domain function and the standard filter frequency-domain function; and
using the mean value of the amplitude differences or the area value enclosed by the frequency-response curves as the error data for the earphone sound effect compensation.

2. The method according to claim 1, wherein the obtaining monitored signal data in a current wearing state of an earphone user according to a signal collected by the monitoring microphone and an audio signal played by a loudspeaker of the earphone comprises:
in the current wearing state, computing a current filter function corresponding to an acoustic path of the coupled cavity according to a cross-correlation function between the signal collected by the monitoring microphone and the audio signal played by the loudspeaker of the earphone, so as to obtain the monitored signal data regarding the current wearing state of the earphone user based on the current filter function;
wherein obtaining the standard signal data in the standard wearing state of the earphone comprises:
in the standard wearing state, computing a standard filter function corresponding to the acoustic path of the coupled cavity according to a cross-relation function between the signal collected by the monitoring microphone and an M-sequence signal played by the loudspeaker of the earphone, thereby obtaining the standard signal data according to the standard filter function.

3. The method according to claim 2, wherein the obtaining monitored signal data in a current wearing state of an earphone user according to a signal collected by the monitoring microphone and an audio signal played by a loudspeaker of the earphone further comprises:
in the current wearing state, computing current filter functions of respective time points by adaptive filtering within a predetermined time;
setting a data window, and sampling current filter functions of the respective time points based on the data window;
when a mean variance of a predetermined number of continuously sampled current filter functions does not exceed a steady-state threshold, determining that the computed current filter functions of the respective time points reach a steady state; and using any one of the current filter functions that reach the steady state or a mean value of the current filter functions of the respective time points as the monitored signal data.

4. The method according to claim 1, wherein the performing sound effect compensation to the earphone according to the error data comprises:
presetting a first threshold and a second threshold that is less than the first threshold; performing the following processing to each of the frequency bands divided according to the sound effect, respectively:
when confirming, based on the error data, that an amplitude value of the current filter frequency-domain function is in an attenuated state relative to that of the standard filter frequency-domain function, and that an attenuated value exceeds the first threshold, performing EQ (Equalizer) sound effect compensation and DRC (Dynamic Range Control) sound effect compensation concurrently to the audio signal played by the loudspeaker;
when confirming, based on the error data, that the amplitude value of the current filter frequency-domain function relative to that of the standard filter frequency-domain function is in an attenuated state, and that an attenuated value is less than the first threshold but larger than the second threshold, only performing the EQ sound effect compensation to the audio signal played by the loudspeaker;
when confirming, based on the error data, that the amplitude value of the current filter frequency-domain function is in an enhanced state relative to that of the standard filter frequency domain function, and that an enhanced value is larger than the second threshold, only performing EQ sound effect compensation to the audio signal played by the loudspeaker; and
when confirming, based on the error data, that an amplitude value change of the current filter frequency-domain function relative to the standard filter frequency-domain function is less than the second threshold, not performing sound effect compensation to the audio signal played by the loudspeaker.

5. The method according to claim 1, wherein the method further comprises:
obtaining and storing wearing signal data and sound effect compensation data of the earphone in different wearing states;
matching the monitored signal data in the current wearing state with the wearing signal data in different wearing states to obtain corresponding sound effect compensation data; and
performing sound effect compensation to the earphone based on the obtained sound effect compensation data.

6. An apparatus for earphone sound effect compensation, wherein the apparatus comprises:

a monitored data obtaining unit configured to obtain monitored signal data in a current wearing state of an earphone user according to a signal collected by a monitoring microphone provided within a coupled cavity for coupling the earphone to a human ear and an audio signal played by a loudspeaker of the earphone;

an error data computing unit configured to compute error data of the monitored signal data in the current wearing state relative to standard signal data in a standard wearing state of the earphone; and a sound effect compensating unit configured to perform sound effect compensation to the earphone according to the error data;

wherein the error data computing unit comprises:

a frequency-domain function computing module configured to compute a current filter frequency-domain function of a current filter function, and compute a standard filter frequency-domain function of a standard filter function;

a frequency band dividing module configured to divide a frequency into a predetermined number of frequency bands according to the sound effect; and an error data computing module configured to, on each of the frequency bands, compute a mean value of amplitude differences of the frequency-response curves of the current filter frequency-domain function and the standard filter frequency-domain function, or compute an area value enclosed by the frequency-response curves of the current filter frequency-domain function and the standard filter frequency-domain function; and use the mean value of the amplitude differences or the area value enclosed by the frequency-response curves as the error data for the earphone sound effect compensation.

7. The apparatus according to claim 6, wherein the monitored data obtaining unit comprises:

a filter function computing module configured to compute a current filter function corresponding to an acoustic path of the coupled cavity according to a cross-correlation function between the signal collected by the monitoring microphone and the audio signal played by the loudspeaker of the earphone;

an adaptive filtering module configured to, in the current wearing state, compute current filter functions of respective time points by adaptive filtering within a predetermined time;

a sampling module configured to set a data window, and sample current filter functions of the respective time points based on the data window;

a steady-state determining module configured to, when a mean variance of a predetermined number of continuously sampled current filter functions does not exceed a steady-state threshold, determine that the computed current filter functions of the respective time points reach a steady state; and a monitored data determining module configured to use any one of the current filter functions that reach the steady state or a mean value of the current filter functions of the respective time points as the monitored signal data.

8. The apparatus according to claim 6, wherein the sound effect compensating unit comprises:

a threshold value and frequency-band setting module configured to preset a first threshold and a second threshold that is less than the first threshold; and perform sound effect compensation to each of the frequency bands divided according to the sound effect, respectively;

a first compensation module configured to when confirming, based on the error data, that an amplitude value of the current filter frequency-domain function is in an attenuated state relative to that of the standard filter frequency-domain function, and that an attenuated value exceeds the first threshold, perform EQ (Equalizer) sound effect compensation and DRC (Dynamic Range Control) sound effect compensation concurrently to the audio signal played by the loudspeaker;

a second compensating module configured to when confirming, based on the error data, that the amplitude value of the current filter frequency-domain function relative to that of the standard filter frequency-domain function is in an attenuated state, and that an attenuated value is less than the first threshold but larger than the second threshold, only perform the EQ sound effect compensation to the audio signal played by the loudspeaker;

a third compensating module configured to when confirming, based on the error data, that the amplitude value of the current filter frequency-domain function is in an enhanced state relative to that of the standard filter frequency-domain function, and that an enhanced value is larger than the second threshold, only perform EQ sound effect compensation to the audio signal played by the loudspeaker; and a sound effect holding module configured to when confirming, based on the error data, that an amplitude value change of the current filter frequency-domain function relative to the standard filter frequency-domain function is less than the second threshold, not perform sound effect compensation to the audio signal played by the loudspeaker.

9. The apparatus according to claim 6, wherein the apparatus further comprises:

a wearing data obtaining unit configured to obtain and store wearing signal data and sound effect compensation data of the earphone in different wearing states;

the error data computing unit further configured to match the monitored signal data in the current wearing state with the wearing signal data in different wearing states to obtain corresponding sound effect compensation data; and the sound effect compensating unit further configured to perform sound effect compensation to the earphone based on the obtained sound effect compensation data.

10. An earphone, characterized by comprising the apparatus for earphone sound effect compensation according to claim 6, and a monitoring microphone provided within a coupled cavity coupling the earphone to a human ear.

* * * * *